United States Patent [19]
Wiesler et al.

[11] Patent Number: 5,647,718
[45] Date of Patent: Jul. 15, 1997

[54] STRAIGHT LINE WAFER TRANSFER SYSTEM

[75] Inventors: Mordechai Wiesler, Lexington, Mass.; Mitchell Weiss, Haverford, Pa.

[73] Assignee: PRI Automation, Inc., Billerica, Mass.

[21] Appl. No.: 651,724

[22] Filed: May 22, 1996

Related U.S. Application Data

[60] Provisional application No. 60/000,963, Jul. 7, 1995.

[51] Int. Cl. $^6$ .................................................. B65G 1/04
[52] U.S. Cl. ............................ 414/416; 414/786; 414/937
[58] Field of Search ................................. 414/217, 222, 414/416, 935, 437, 939, 786

[56] References Cited

U.S. PATENT DOCUMENTS

| | | | |
|---|---|---|---|
| 4,427,332 | 1/1984 | Manriquez | 414/937 X |
| 4,775,281 | 10/1988 | Prentakis | 414/937 X |
| 4,778,331 | 10/1988 | Kimata et al. | 414/661 |
| 4,900,212 | 2/1990 | Mikahara | 414/937 X |
| 5,026,239 | 6/1991 | Chiba et al. | 414/937 X |
| 5,030,056 | 7/1991 | Kitayama et al. | 414/416 X |
| 5,061,144 | 10/1991 | Akimoto | 414/937 X |
| 5,183,370 | 2/1993 | Cruz | 414/416 |
| 5,382,128 | 1/1995 | Takabashi et al. | 414/416 X |
| 5,387,067 | 2/1995 | Grunes | 414/937 X |
| 5,409,348 | 4/1995 | Suzuki | 414/937 X |
| 5,443,346 | 8/1995 | Murata et al. | 414/937 X |
| 5,460,478 | 10/1995 | Akimoto et al. | 414/937 X |
| 5,464,313 | 11/1995 | Ohsawa | 414/937 X |

FOREIGN PATENT DOCUMENTS

| | | | |
|---|---|---|---|
| 63-181441 | 7/1988 | Japan . | |
| 276261 | 11/1990 | Japan | 414/416 |
| 106952 | 4/1992 | Japan | 414/937 |
| 87507 | 3/1994 | Japan | 414/937 |

*Primary Examiner*—David A. Bucci
*Attorney, Agent, or Firm*—Weingarten, Schurgin, Gagnebin & Hayes LLP

[57] ABSTRACT

A wafer transfer system is operable with a front or side loading wafer carrier to move one or more wafers in a straight line from the carrier to a position in which the wafers are accessible for further processing by movement along the same straight line. The transfer system provides a wafer extractor which employs a plurality of paired fingers of a size and configuration to fit between the spaced, stacked wafers in the carrier. After insertion between the wafers, the fingers are movable by a small amount vertically to lift the wafers off the shoulders of the carrier. The fingers, now supporting the wafers, are movable generally horizontally along a straight line to remove the wafers from the carrier. The fingers are supported from a support structure in a manner which provides clearance for the wafers to pass through the support structure for further processing along the same straight line path.

16 Claims, 5 Drawing Sheets

5,647,718

STRAIGHT LINE WAFER TRANSFER SYSTEM

RELATED APPLICATIONS

This application claims the benefit of U.S. Provisional Application No. 60/000,963, filed Jul. 7, 1995.

This application is related to the patent applications of the same inventors entitled Wafer Transfer System Having Vertical Lifting Capability, U.S. patent application Ser. No. 08/651,395, filed on May 22, 1996, currently pending, and Wafer Transfer System Having Rotational Capability, U.S. patent application Ser. No. 08/651,715, filed on May 22, 1996, currently pending, the disclosures of which are incorporated by reference herein.

FIELD OF THE INVENTION

This invention relates to article handling apparatus and more particularly to semiconductor wafer handling apparatus.

BACKGROUND OF THE INVENTION

In the fabrication of semiconductor wafers, a plurality of wafers is usually disposed in a stacked, spaced apart relationship within a sealed carrier or pod having a door openable on one face of the carrier. The carrier when sealed provides a substantially contaminant-free environment for the wafers disposed therein, and these wafers can be moved within the carrier to various intended positions for processing into semiconductor devices or circuits. Often the wafers are stored in a cassette which is itself retainable in the carrier. The cassette is removable from the carrier for transferring the wafers from the carrier to the processing equipment. The carrier and cassette can maintain the wafers either horizontally or vertically.

In cassette-based systems, when the carrier is installed in position on processing apparatus, the carrier door is opened and the cassette within the carrier is removed from the carrier by a robot arm or other suitable transfer mechanism to a position at which one or more wafers can be removed from the cassette for conveyance to intended positions for subsequent processing. This motion typically involves a translation of the cassette out of the carrier along a straight line, either vertically or horizontally, and then a rotation of the cassette to a position in which the wafers are accessible to the processing apparatus. In similar fashion, wafers can be loaded into respective slots of the cassette and the cassette when fully loaded can be moved into the carrier by a rotation followed by a translation. The rotation of the wafers occurs over a separate area of the floor space than the translation of the wafers, thereby increasing the overall footprint of the device.

Recently, the semiconductor industry has begun manufacturing larger wafers having a diameter of 300 mm. Additionally, cassetteless carriers for these larger wafers are being introduced. These carriers hold the wafers horizontally on shoulders formed on the interior surfaces of the carrier. The same motion pattern of a translation followed by a rotation is typically used in the removal of the wafers from the cassetteless carrier.

While the art of wafer transport and handling for semiconductor processing has become quite sophisticated and well developed, reducing the complexity and size of wafer transfer apparatus would be beneficial.

SUMMARY OF THE INVENTION

The present invention provides a wafer transfer system in which one or more wafers stored horizontally in a support device, such as a carrier or cassette, can be moved generally horizontally along a straight line path to a position in which the wafers are accessible for further processing without additional reorientation of the wafers. Thus, from this position, individual wafers or groups of wafers can be accessed and moved in either direction along the same straight line path by the transfer mechanism of the particular process.

More particularly, the wafers are retained horizontally in a spaced, stacked array on shoulders of a front or side loading carrier. The wafers need not be stored in a separate cassette in the carrier, although a cassette may be employed if desired. The carrier has an opening on the front or side which is typically sealed by a removable door to provide access to the wafers stored therein.

The transfer system provides an extractor having at least one pair of horizontally extending fingers cantilevered from a support structure or frame. Typically, a plurality of vertically spaced pairs of fingers are provided in a size and configuration to fit beneath and between the spaced, stacked wafers in the carrier. The extractor is horizontally translatable to insert the fingers beneath associated wafers within the carrier. The extractor is also movable with a small vertical component to bring the fingers into contact with the bottom surface of the wafers to lift the wafers off the shoulders of the carrier. The extractor is then horizontally translatable out of the carrier to remove the wafers therefrom. The fingers of the extractor are cantilevered from the support structure and inwardly offset from the support structure to provide clearance for the wafers to pass through the support structure along the same straight line path. In this manner, the wafers can be accessed by the processing equipment without a further reorientation, such as a rotation, of the wafers.

DESCRIPTION OF THE DRAWINGS

The invention will be more fully understood from the following detailed description taken in conjunction with the accompanying drawings in which.

DETAILED DESCRIPTION OF THE INVENTION

Figure 1:
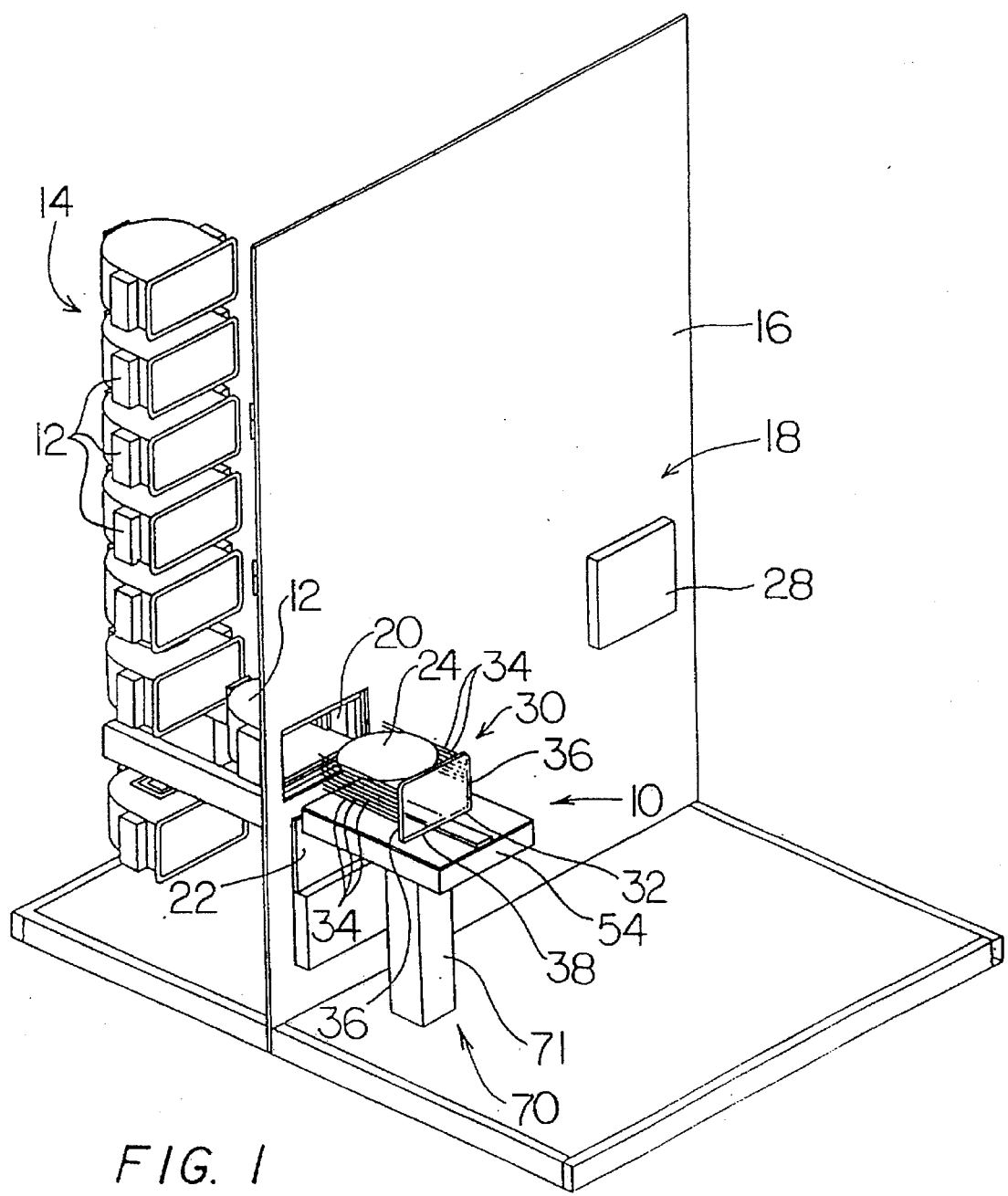
FIG. 1 is a perspective view of a wafer transfer system according to the present invention employing a vertical elevator.

A transfer system 10 according to the present invention is shown generally in FIG. 1. In the configuration shown, a plurality of carriers 12 are held in a storage device 14 on the opposite side of a wall 16 of a contaminant-free environment 18 containing processing equipment (not shown). The carrier 12 to be accessed is positioned adjacent and sealed against an opening 20 in the wall 16. A door 22 sealing the opening is removable to reveal semiconductor wafers 24 stacked horizontally on paired, opposed shoulders 26 inside the carrier 12 (shown in FIGS. 4 and 5), as is known in the art. A transfer system 10 according to the present invention is positioned adjacent the opening 20 in the contaminant-free environment for transferring wafers from the carrier to the processing equipment along a straight line. In the configuration shown, a second door 28 is also provided for access to a carrier; a transfer system may be positioned adjacent this door also, although for clarity it is not shown. Additionally, although illustrated in conjunction with a carrier storage device, the transfer system is operable with any type of wafer handling apparatus.

The transfer system comprises a wafer extractor 30 having a support structure 32 from which are cantilevered one or more pairs of fingers 34 for supporting the wafers 24. In the embodiment shown more particularly in FIGS. 2 through 5, the support structure comprises a frame formed by two columns 36 supported by a lower beam 38 and connected together at their upper ends by an upper beam 40 in a box configuration. The upstanding columns are spaced apart horizontally a distance greater than the diameter of the wafers 24 to be transferred to or from the carrier. This spacing allows the wafers to pass between the columns along a straight line path, as discussed further below. The support structure 32 is mounted for horizontal translation and for movement having a small vertical component, also discussed further below. The support structure can be configured in any other manner to provide clearance for movement of the wafers therethrough.

Figure 2:
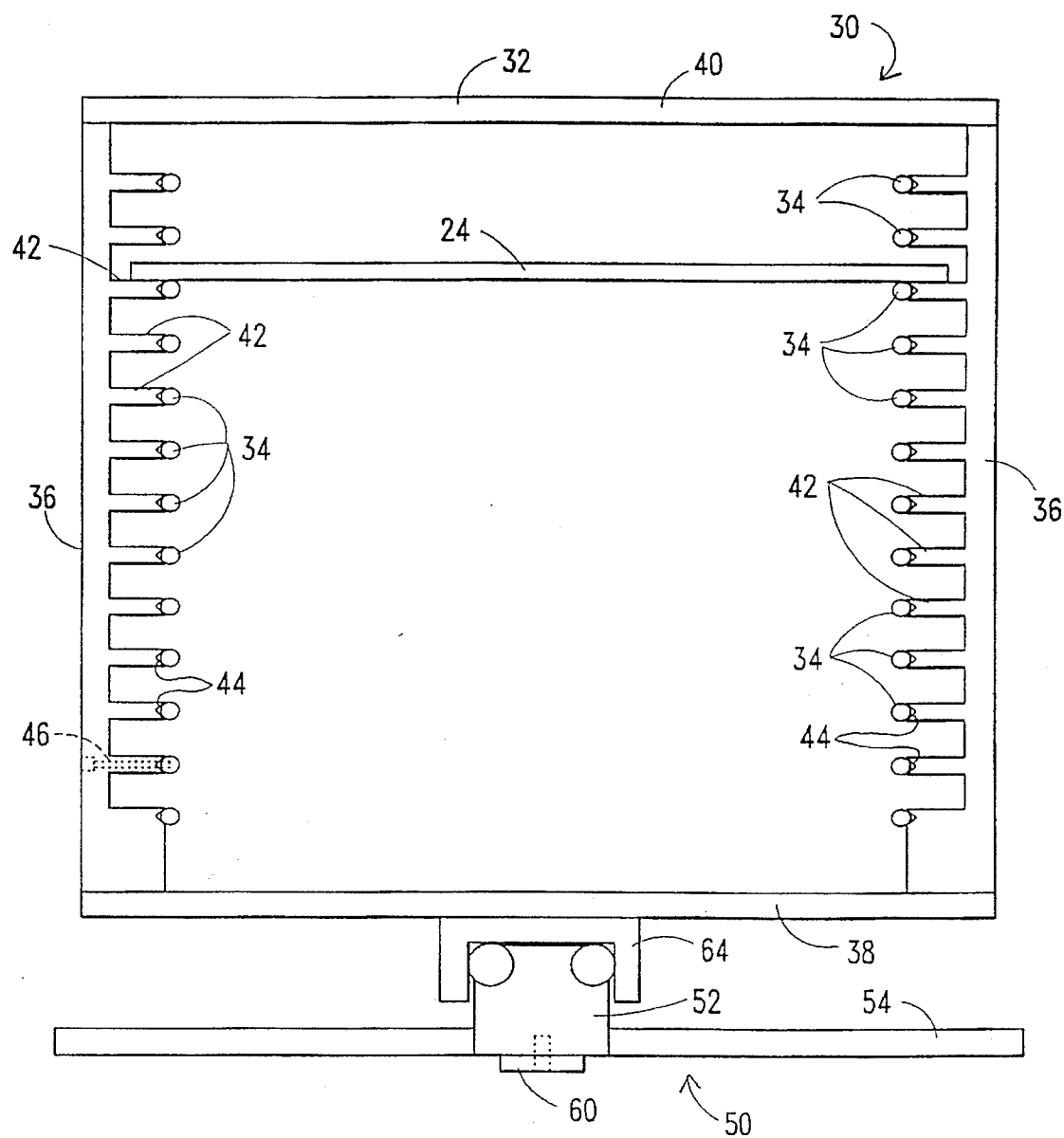
FIG. 2 is a front view of a further embodiment of the wafer transfer system of the present invention employing a tilting mechanism.
Figure 3:
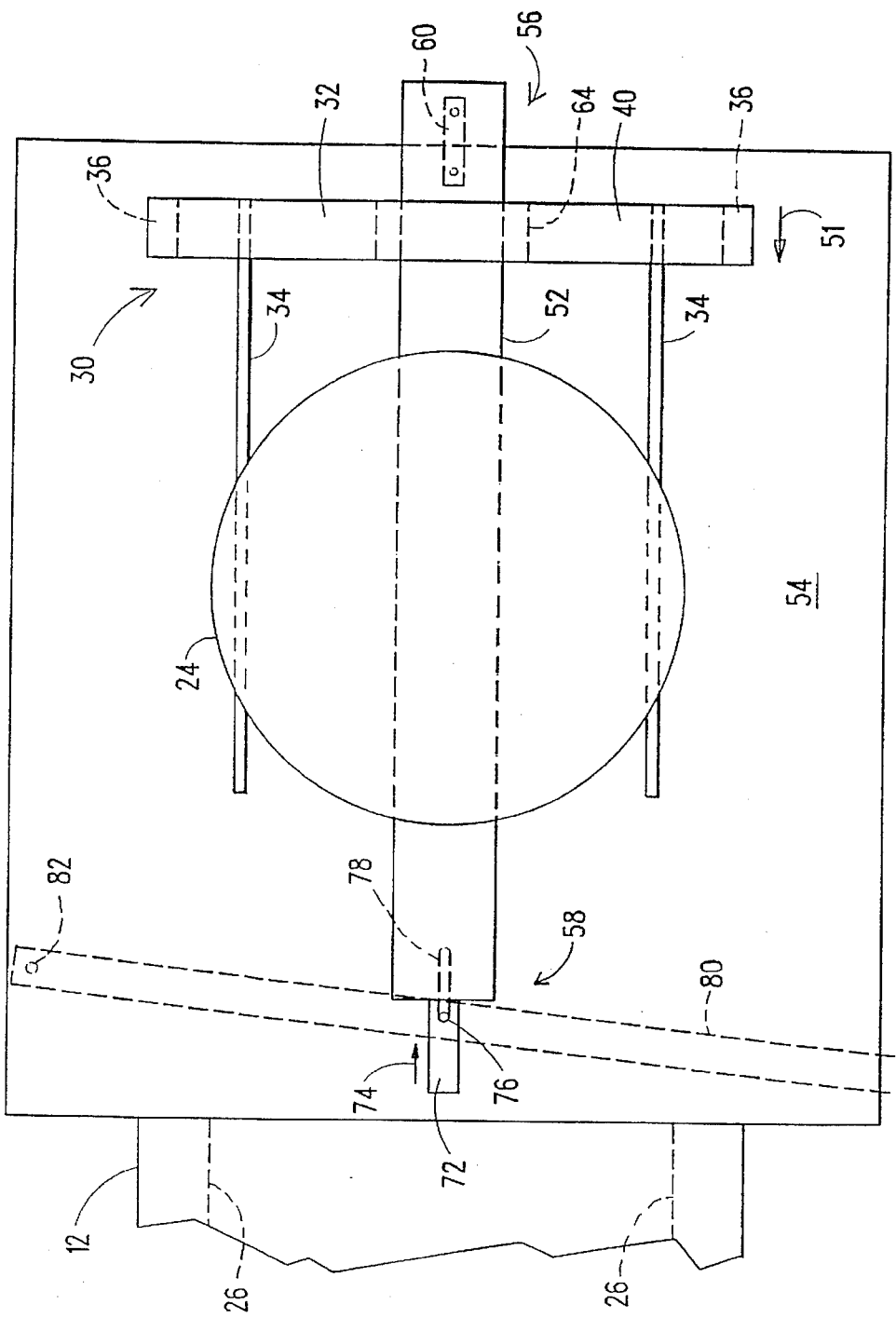
FIG. 3 is a top view of the wafer transfer system of FIG. 2.

The fingers 34 of the extractor 30 are arranged in pairs stacked vertically along the two columns 36. Each pair lies in a generally horizontal plane with one finger 34 of each pair cantilevered from an associated column 36. As best seen in FIGS. 2 and 3, each finger 34 is inwardly offset from its associated column 36 and extends generally horizontally from the support structure 32 toward the carrier 12. To offset the fingers, each finger is supported by a tab 42 whose upper surface is no higher than the upper surface of the finger 34 so as not to interfere with passage of the wafers 24 between the columns 36 of the support structure 32. For example, in the embodiment shown, each finger 34 is a rod having a circular cross-section. The tabs 42 are a plurality of inwardly extending members integrally formed with the columns 36 and having a thickness no greater than the diameter of the rods. A notch 44 is formed in the end of each tab into which a portion of an associated rod is placed. The rods are retained in the notch by a screw 46, only one of which is indicated in FIG. 2 for clarity. Other ways of mounting the fingers to the columns with a clearance offset may be used. For example, the tabs can be integrally formed with the fingers such as by bending the fingers near one end to form a short leg which may be fastened to the columns in any appropriate manner.

Figure 5:
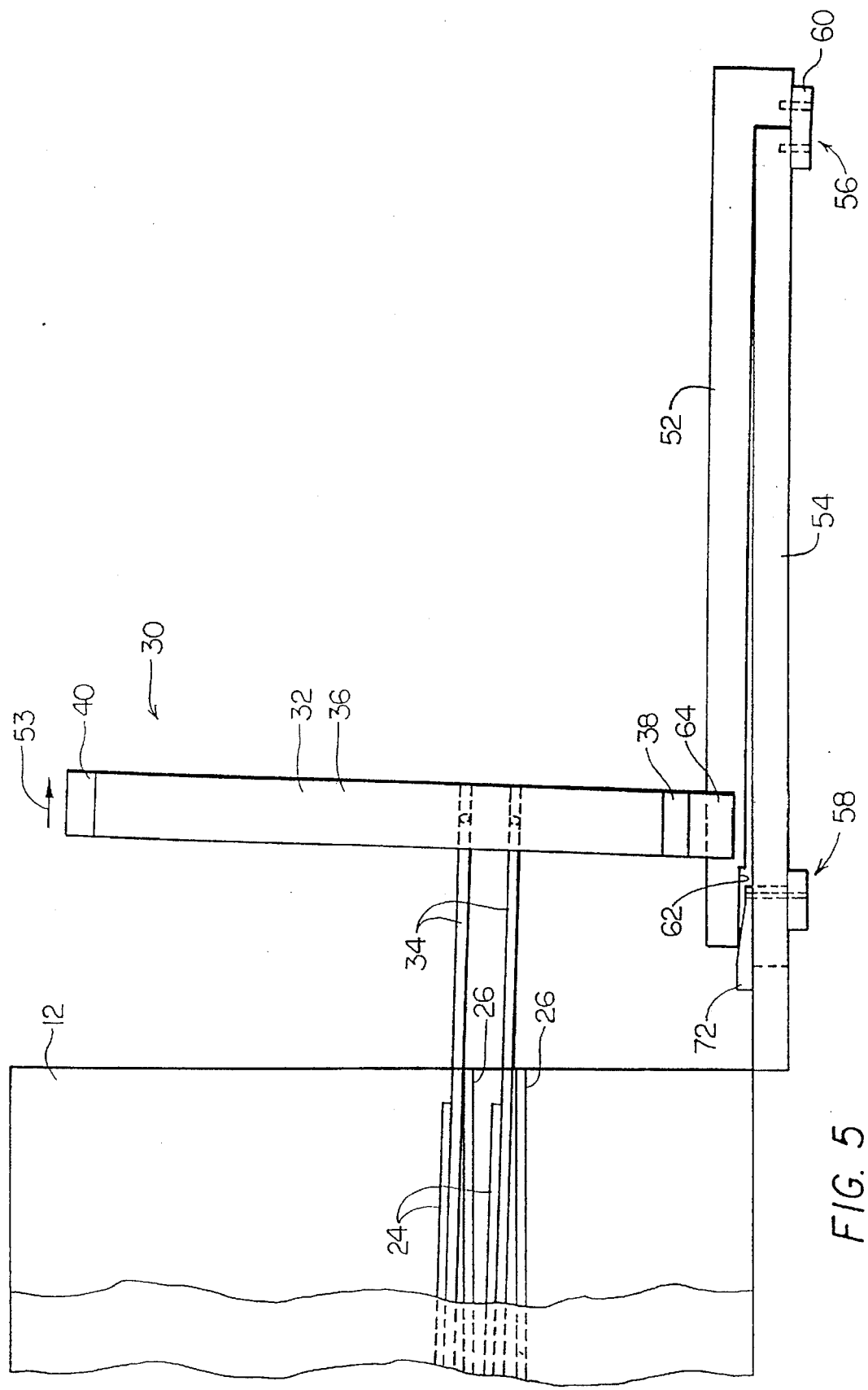
FIG. 5 is a side view of the wafer transfer system of FIG. 2 in a position within a wafer carrier.

The pairs of fingers 34 are spaced apart vertically along the columns 36 with a pitch or spacing between corresponding points approximately equal to the vertical pitch of the wafers 24 in the carrier 12, as best seen in FIG. 5. This spacing allows the fingers 34 to be inserted beneath and between associated wafers 24 stacked in the carrier 12. Referring to FIG. 3, the fingers 34 of each pair are horizontally spaced apart from each other a distance which allows them to support the wafers 24 slightly inwardly of the wafers' edges and of the shoulders 26 in the carrier 12 to thereby lift the wafers 24 off the shoulders 26. The pairs of fingers are typically provided in a number equal to the number of wafers storable in the carrier, generally thirteen or twenty-five for cassetteless carriers. An extractor having thirteen pairs of fingers can also be used to extract wafers from a carrier holding twenty-five wafers by making two passes. However, any desired number of pairs of fingers can be provided.

The extractor 30 is reciprocally movable, indicated by arrows 51, 53, by a horizontal transport mechanism 50 in a generally horizontal plane to insert the fingers 34 into the open carrier 12, with each pair of fingers fitting beneath an associated wafer 24. The extractor is also movable with a small vertical component by a lifting mechanism 70 to bring each finger 34 into contact with the bottom surface of its associated wafer 24 to lift each wafer off the shoulders 26 in the carrier 12. Once the wafers have been lifted up, the extractor 30 is moved horizontally back out of the carrier 12 by the transport mechanism 50, thereby moving the wafers out of the carrier 12.

The horizontal transport mechanism 50 may comprise a track 52 mounted to a fixed base plate 54 and extending from a distal location 56 to a location 58 proximal the opening of the carrier. The track is hinged to the base plate at the distal location 56 in any suitable manner for a purpose to be discussed below. For example, a flexible strap 60 can be fastened to the underneath of the track and the base plate. A cut out 62 is formed at the opposite end of the track 52 at the proximal location 58, also for a purpose to be discussed below. The extractor 30 is mounted for reciprocal motion along the track, illustrated schematically by a U-shaped guideway 64 fastened to the underside of the lower beam 38 of the support frame 32 for maintaining the extractor on the track. Any suitable actuator, as would be known in the art, may be used to move the extractor along the track. It will be appreciated, however, that any suitable mechanism for providing horizontal reciprocal motion of the extractor can be used in the present invention. For example, a linkage or robot arm configured to provide straight-line motion can be used to drive the extractor. The horizontal transport mechanism can be controlled in any suitable manner, such as by a microprocessor-based controller, as would be known in the art.

The lifting mechanism 70 provides the extractor with a small vertical component of motion. The lifting mechanism can comprise a vertical elevator 71 disposed below the base plate 54, shown schematically in FIG. 1. Any suitable elevator mechanism, as would be known in the art, may be used. The vertical motion component could also be supplied by moving the carrier vertically by an elevator, rather than by moving the extractor. Any suitable controller can be provided to control the lifting mechanism.

Figure 4:
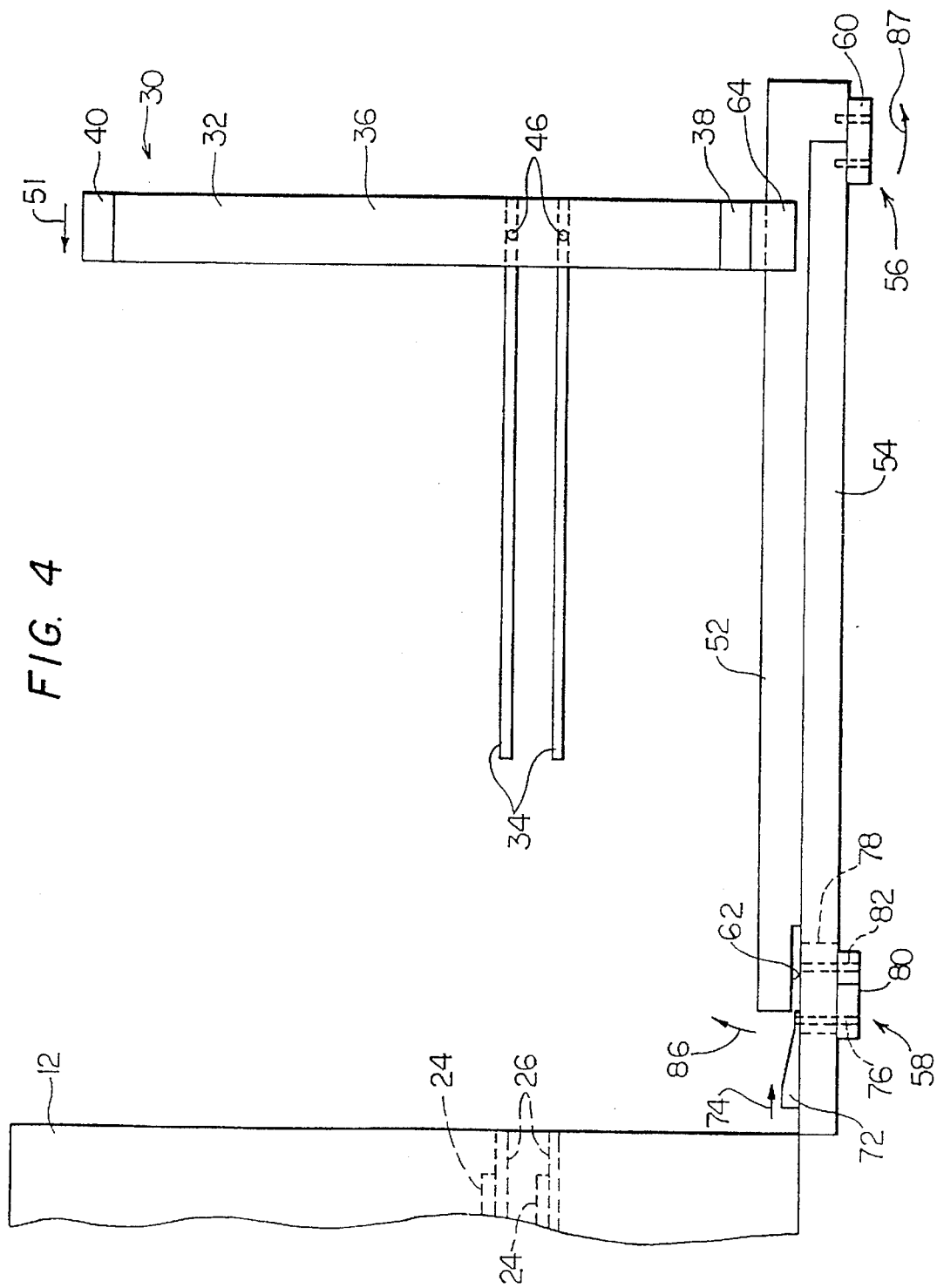
FIG. 4 is a side view of the wafer transfer system of FIG. 2 in a wafer accessible position.

Alternatively, referring to FIGS. 3 through 5, the lifting mechanism 70 can supply the vertical component of motion by tilting the fingers 34 through a small angle into contact with an undersurface of the associated wafers 24 sufficiently to lift the wafers off the support shoulders in the carrier 12. For example, a wedge 72 may be provided at the end of the track 52. By virtue of the cut out 62 in the track, the wedge is movable to a position underneath the track, indicated by the arrow 74, thereby tilting the track upwardly slightly about the hinge 60 at the distal location 56. The wedge 72 can be moved in any suitable manner, as by a pin 76 extending through a slot 78 in the base plate 54. The pin 76 is fastened to an arm 80 which may be pivoted, as by a suitable motorized mechanism, about a further pin 82 fixed to the base plate 54, whereby pivoting of the arm 80 causes movement of the wedge 72, as indicated by the arrows 84, 74. The wedge 72 tilts the track 52, which in turn causes the extractor 30 to tilt, as indicated by arrows 86, 87. The tilting of the extractor 30 lifts the wafers 24 off the shoulders 26 in the carrier 12 on the fingers 34. Due to the relatively long distance between the wedge 72 at the proximal location 58 and the hinge 60 at the distal location 56, only a small vertical component of motion results. After the wafers 24 have been lifted off the shoulders 26, the extractor 30 is moved generally horizontally back along the track 52 to withdraw the wafers from the carrier. It will be appreciated that the entire extractor follows a slightly angled path if the extractor is tilted to lift the wafers off the shoulders; however, the angle is so small that the path can be considered to be generally horizontal.

Once the wafers 24 have been extracted from the carrier 12, they are in a processing-accessible position. The processing equipment (not shown) is able to remove one or more wafers from the extractor for further processing. The wafers pass between the columns 36 of the extractor 30 along the same straight line path taken out of the carrier 12. It will be appreciated that this path can deviate slightly from the straight line path taken by the wafers out of the carrier, for example, if the extractor was tilted to lift the wafers, while still accomplishing the objectives of the present invention. The term "same straight line path" is intended to encompass such slight deviations.

To reload the carrier 12, the processing equipment moves the wafers 24 back onto the fingers 34 in the extractor 30 along the straight line path. The extractor 30 is moved horizontally along the straight line path until the fingers 34 and wafers 24 have been inserted into the carrier. The extractor 30 is moved with a small vertical component to lower the wafers 24 onto the shoulders 26 of the carrier 12 and horizontally translated to remove the unloaded fingers 34 from the carrier 12.

The transfer mechanism of the present invention is less complex than existing apparatus which use multi-axis transfer mechanisms, since the mechanism of the present invention provides movement along only a single axis. The mechanism makes possible higher machine throughput and has improved positioning accuracy over plastic cassettes. The present invention provides a transfer system having a smaller footprint than present systems, since there is no need for a reorienting mechanism to move the wafers to a processing-accessible position after removal from the carrier, as with known systems. Moreover, the present invention requires no additional cassette transfer or orientation mechanism as in present systems. Additionally, the carrier design can be smaller.

The invention is compatible with high temperature wafers and is operable in both vacuum and atmospheric processes. For atmospheric processes, the transfer system is preferably made from aluminum or plastic materials. For vacuum processes, the materials are preferably ceramics and stainless steels, which do not outgas. Although designed primarily for use with cassetteless carriers, the transfer system of the present invention can be implemented with cassette-based systems if desired. Additionally, the transfer system can be used to remove one or any number of wafers.

The invention is not to be limited by what has been particularly shown and described, except as indicated by the appended claims.

We claim:

1. A semiconductor wafer transfer system for moving a wafer along a horizontal straight line path into and out of a wafer support device to and from a position in which the wafer is accessible along the straight line path for further processing, the wafer support device having opposed, paired shoulders on interior walls thereof to horizontally support the wafer, the support device further having a vertical opening therein, the wafer transfer system comprising:

a support structure positionable adjacent the opening in the wafer support device, the support structure having support elements defining a wafer clearance opening therebetween and having a horizontal dimension greater than a diameter of the wafer, the wafer clearance opening aligned to allow the wafer to pass horizontally through the wafer clearance opening in a horizontal orientation along the horizontal straight line path;

a finger structure mounted to the support structure to extend generally horizontally toward the opening in the support device and having a finger configuration disposed to support the wafer, the finger configuration fixed with respect to the support structure and sized to fit within the support device to hold the wafer off the shoulders; and a generally horizontally reciprocal transport mechanism connected to the support structure to move the support structure into and out of the wafer support device along the horizontal straight line path with the finger structure aligned to hold the wafer.

2. The wafer transfer system of claim 1, wherein the support structure comprises two upstanding members horizontally spaced apart a distance greater than a diameter of the wafer to define the clearance opening.

3. The wafer transfer system of claim 2, wherein the finger structure comprises a pair of fingers, each finger mounted to a respective upstanding member by an offset to extend from an inwardly facing portion of the upstanding member outwardly in a generally horizontal plane toward the opening in the support device, the fingers being spaced apart a distance to fit beneath the wafer in the wafer support device at a location inwardly of the shoulders.

4. The wafer transfer system of claim 3, wherein the offset is provided by two opposed tab members extending horizontally inwardly from the upstanding members, the fingers fastened to associated tab members such that the tab members do not extend above the upper surface of the fingers.

5. The wafer transfer system of claim 4, wherein the tab members are integrally formed with the upstanding members and have finger receiving notches formed in ends thereof, a portion of each finger being retained in an associated notch.

6. The wafer transfer system of claim 3, wherein the offset is integrally formed with the finger.

7. The wafer transfer system of claim 2, wherein the finger structure further comprises a plurality of pairs of fingers, each finger of each pair mounted to a respective upstanding member by an offset to extend from an inwardly facing portion of the upstanding member outwardly in a generally horizontal plane toward the opening in the support device, the fingers of each pair being spaced apart a distance to fit beneath the wafer in the wafer support device inwardly of the shoulders, the pairs being vertically spaced apart a distance to fit between a plurality of wafers in the wafer support device.

8. The wafer transfer system of claim 2, wherein the support structure further comprises a lower beam member and an upper beam member fastened at upper and lower ends respectively to the two upstanding members.

9. The wafer transfer system of claim 1, wherein the horizontally reciprocal transport mechanism comprises a track mounted to a base, the support structure being mounted for reciprocal motion along the track.

10. The wafer transfer system of claim 1, further comprising a lifting mechanism for providing a component of relative vertical motion between the support structure and the wafer support device to bring the fingers into and out of contact with the undersurface of the wafer for lifting the wafer off and loading the wafer onto the shoulders of the support device.

11. The wafer transfer system of claim 1, wherein the finger structure comprises a pair of fingers extending horizontally away from the wafer clearance opening, each finger mounted to the support structure and spaced from each other in a horizontal plane to define an opening between the fingers continuous with the wafer clearance opening.

12. The wafer transfer system of claim 1, wherein the wafer clearance opening is horizontally aligned with the finger structure and disposed on an opposite side of the finger structure from the wafer support device.

13. A semiconductor wafer transfer system for moving a wafer in a straight line manner into and out of a wafer support device to and from a processing accessible position, the wafer support device having opposed, paired shoulders on interior walls thereof to horizontally support the wafer, the support device further having a vertical opening therein, the wafer transfer system comprising:

means for lifting the wafer off and depositing the wafer onto the shoulders in the wafer support device, the lifting means comprising a finger structure disposed to extend generally horizontally toward the opening in the support device and having a finger configuration sized to fit within the support device in alignment with the wafer, and a lifting mechanism disposed to provide a component of relative vertical motion between the finger structure and the wafer support device to bring the finger configuration into and out of contact with the wafer for lifting the wafer off and loading the wafer onto the shoulders of the support device;

means for translating the wafer generally horizontally into and out of the wafer support device along a horizontal straight line path; and means, comprising support elements defining a wafer clearance opening therebetween having a horizontal dimension greater than a diameter of the wafer, for making the wafer accessible to further processing equipment by movement of the wafer horizontally through the wafer clearance opening substantially along the horizontal straight line path.

14. The wafer transport system of claim 13, wherein the means for making the wafer accessible further comprises a pair of fingers, each finger mounted to the support structure by an inwardly extending offset.

15. The wafer transport system of claim 13, wherein the means for translating the wafer generally horizontally comprise a support structure positionable adjacent the opening in the wafer support device, a finger structure mounted to the support structure to extend generally horizontally toward the opening in the support device and having a finger configuration sized to fit within the support device to hold the wafer off the shoulders, and a generally horizontally reciprocal transport mechanism connected to the support structure to move the support structure into and out of the wafer support device along the straight line path with the finger structure aligned to hold the wafer.

16. A process for moving a wafer in a straight line manner from a wafer support device for processing, the wafer support device having opposed, paired shoulders on interior walls thereof to horizontally support the wafer, the support device further having a vertical opening therein, the process comprising:

providing a wafer transfer device having support elements defining a wafer clearance opening therebetween, the clearance opening having a horizontal dimension greater than a diameter of the wafer;

lifting the wafer off the shoulders in the wafer support device by the wafer transfer device;

moving the wafer by the wafer transfer device along a generally horizontal path out of the support device to a position in which the wafer is accessible by wafer processing equipment through the clearance opening; and accessing the wafer with the processing equipment and moving the wafer along the generally horizontal path horizontally through the clearance opening.

* * * * *